United States Patent
Kim et al.

(10) Patent No.: US 7,317,645 B2
(45) Date of Patent: Jan. 8, 2008

(54) REDUNDANCY REPAIR CIRCUIT AND A REDUNDANCY REPAIR METHOD THEREFOR

(75) Inventors: Jun-Hyung Kim, Yongin-si (KR);
Chi-Wook Kim, Hwaseong-si (KR);
Sung-Min Seo, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/092,097

(22) Filed: Mar. 29, 2005

(65) Prior Publication Data

US 2005/0270863 A1 Dec. 8, 2005

(30) Foreign Application Priority Data

Jun. 7, 2004 (KR) ...................... 10-2004-0041313

(51) Int. Cl.
*G11C 7/00* (2006.01)
(52) U.S. Cl. .................... 365/200; 365/225.7
(58) Field of Classification Search ............... 365/200, 365/225.7
See application file for complete search history.

(56) References Cited

U.S. PATENT DOCUMENTS 5,835,425 A    11/1998  Berger ..................... 365/200
6,310,806 B1 * 10/2001  Higashi et al. ............. 365/200
6,385,071 B1 *  5/2002  Chai et al. .................. 365/49
6,714,451 B2 *  3/2004  Ooishi et al. ........... 365/185.09
6,741,509 B2 *  5/2004  Kato et al. ................. 365/200
6,901,015 B2 *  5/2005  Shinohara ................. 365/200

FOREIGN PATENT DOCUMENTS

JP    11-260094    9/1999
KR    2002-0025348    4/2002

* cited by examiner

*Primary Examiner*—Hoai V. Ho
(74) *Attorney, Agent, or Firm*—F. Chau & Assoc., LLC

(57) ABSTRACT

A redundancy repair circuit and method therefor for use with a semiconductor memory device are provided. The redundancy repair circuit comprises: a memory circuit having a plurality of address lines and a plurality of redundancy address lines in a memory cell; a repair redundancy control circuit for repairing a defective address line using a redundancy address line of the plurality of redundancy address lines, and for encoding and outputting fuse repair information corresponding to redundancy address information, wherein addresses corresponding to defective memory cells are pre-programmed; and a redundancy line driver for receiving the fuse repair information from the repair redundancy control circuit, for decoding the fuse repair information and for activating a redundancy line corresponding to the decoded fuse repair information, wherein the repair redundancy control circuit is separate from the redundancy line driver.

20 Claims, 8 Drawing Sheets

REDUNDANCY REPAIR CIRCUIT AND A REDUNDANCY REPAIR METHOD THEREFOR

This application claims priority to Korean Patent Application No. 2004-41313, filed on Jun. 7, 2004, in the Korean Intellectual Property Office, the disclosure of which is incorporated herein in its entirety by reference.

1. Field of the Invention

The present invention relates to a semiconductor memory device, and more particularly, to a redundancy repair circuit for a semiconductor memory device and a redundancy repair method therefor.

2. Description of the Related Art

A semiconductor memory device, for example, a DRAM (Dynamic Random Access Memory) includes a plurality of memory cells that are arranged in a row/column array. Each memory cell in the row/column array generally stores information in one bit. In the row/column array, column lines are arranged to intersect row lines (e.g., signal lines), respectively. Each memory cell is located at an intersection of a row line and a column line. A memory cell is accessed by addressing a corresponding row line and a column line.

To normally operate a semiconductor memory device, it is necessary to correctly operate all row and column lines of the semiconductor memory device. It is difficult, however, to manufacture a semiconductor memory device where all of its main memory cell arrays operate correctly. Thus, most semiconductor memory devices include a relatively small number of redundancy cell arrays in their memory cell arrays to be substituted for a defective cell or cells.

In a general memory cell array, a redundancy array is formed using redundancy memory cell column lines. In the memory cell array, each redundancy memory cell is connected to each redundancy column line intersecting each row line of a main memory array. Each redundancy column line can be substituted for a defective column line of the main memory cell array. When a column line of the main memory cell array is addressed, a redundancy control block compares the address of the column line with the addresses of defective column lines. If it is determined that the address of the column line is equal to one of the addresses of the defective column lines, the redundancy control block selects and outputs an address of a redundancy column line corresponding to the defective column line instead of the defective column line. Such a redundancy scheme for substituting a redundancy row line for a defective row line can be used in most semiconductor memory devices.

In addition, some semiconductor memory devices include both redundancy row lines and redundancy column lines on a related circuit. In this case, the addresses of defective row/column lines must be programmed in advance in the redundancy control block before the redundancy row/column lines can be used by the redundancy control block. To program the addresses of defective row/column lines, the redundancy control block includes a plurality of fuse blocks. When the semiconductor memory device is in a wafer state, the main memory array is tested and the locations of defective memory cells are recognized.

In a column substitution method, a redundancy control block selects a redundancy column line that is to be substituted for a defective column line. Then, the address of the defective column line is set in the redundancy control block so that the defective column line can be identified by selectively cutting a fuse in a fuse box of the redundancy control block. The fuse may be cut by a laser beam. In a post repair method, defective memory cells, which were detected in a packaged semiconductor memory device, can be repaired.

FIG. 1 shows a bank 11 in a conventional multi-bank semiconductor memory device. Referring to FIG. 1, the bank 11, which is one of a plurality of banks included in the multi-bank semiconductor memory device, includes a normal memory cell 12 and a redundancy memory cell 13. The redundancy memory cell 13 is used to repair a defect generated in the normal memory cell 12.

In FIG. 1, the bank 11 is arranged in a redundancy memory cell column method in which each redundancy memory cell 13 is connected to a redundancy column line intersecting a row line of a main memory cell array. Here, respective redundancy column lines are substituted for one or more defective column lines of a main memory cell array of the multi-bank semiconductor memory device.

A normal column selection line driver 14 and a normal column decoder 15 are located in a column direction of the normal memory cell 12. The normal column selection line driver 14 and the normal column decoder 15 activate a corresponding column selection line of the normal memory cell 12 according to a received column line address.

As further shown in FIG. 1, a plurality of redundancy column selection line drivers 16 and a plurality of redundancy control blocks 17 for driving the redundancy memory cell 13 are provided in the column direction of the redundancy memory cell 13. The plurality of redundancy control blocks 17 include a plurality of fuse boxes capable of being programmed by a laser beam.

Each of the plurality of redundancy control blocks 17 outputs a control signal for activating a corresponding redundancy column selection line if a received column line address is equal to one of the addresses of the defective cells. Each of the plurality of redundancy selection line drivers 16 activates the corresponding redundancy column selection line in response to the control signal received from the redundancy control block 17. For example, each redundancy column selection line driver 16 is connected to 6 redundancy column selection lines (RCSLs).

As shown in FIG. 1, when a redundancy control block 17 is located in the decoder area where the normal column decoder 15 is disposed, the reliability of the semiconductor memory device decreases. However, the capacity of the semiconductor memory device increases and the cell densities of the memory cell array increase, thus resulting in an increased size of the semiconductor memory device. Therefore a need exists for decreasing the size of a semiconductor memory device by decreasing the space required by a column decoder.

SUMMARY OF THE INVENTION

According to an aspect of the present invention, there is provided a redundancy repair circuit comprising: a memory core circuit having a plurality of normal address lines and a plurality of redundancy address lines in a memory cell; a repair redundancy control circuit block, in which predetermined addresses corresponding to defective normal memory cells are programmed in advance for repairing a defective normal address line using a redundancy address line of the plurality of redundancy address lines, and for encoding and outputting repair fuse information corresponding to redundancy address information; and a redundancy line driver for receiving the fuse repair information from the repair redundancy control circuit block for decoding the fuse repair information and for activating a redundancy line corresponding to the decoded fuse repair information, wherein the repair redundancy control circuit block is separate from the redundancy line driver.

If there are N redundancy address lines each representing a specific redundancy address line repaired for each segment, the repair redundancy control circuit block comprises an encoder for encoding the N redundancy address lines using M-bit code information wherein M is smaller than N. The redundancy line driver comprises a decoder for decoding M-bit code information output from the encoder and for outputting the decoded result to a corresponding redundancy address line. The redundancy control circuit block is located in a peripheral circuit of a semiconductor memory device and the redundancy line driver is arranged in a column decoder of the semiconductor memory device.

According to another aspect of the present invention, there is provided a semiconductor memory device comprising: a redundancy memory cell for repairing a defective normal memory cell in a memory cell; a repair redundancy control circuit block, in which predetermined addresses corresponding to defective normal memory cells are programmed in advance for repairing a defective normal address line using a redundancy address line and for coding specific redundancy line information indicating an address of the redundancy memory cell using a predetermined number of bits; and a redundancy line driver for decoding the coded information using a predetermined number of bits and for activating a redundancy address line corresponding to a redundancy address of the decoded result.

The repair redundancy control circuit block is located in a peripheral circuit of the semiconductor memory device and the redundancy line driver is located in an address decoder of the semiconductor memory device. The repair redundancy control circuit block includes a plurality of fuse boxes for programming the addresses to be designated for the defective normal memory cells. If there are N redundancy address lines each representing a specific redundancy address line repaired for each segment, the repair redundancy control circuit block comprises an encoder for encoding the N redundancy address lines using M-bit code information wherein M is smaller than N. The redundancy line driver comprises a decoder for decoding M-bit code information output from the encoder and for outputting the decoded M-bit code information to a corresponding redundancy address line.

According to yet another aspect of the present invention, there is provided a redundancy repair method, comprising: determining whether a received address is a redundancy address; generating redundancy line information designating the redundancy address if the received address is the redundancy address; encoding the redundancy line information using a number of bits; decoding the encoded redundancy line information; and activating a redundancy address line corresponding to the redundancy address according to the decoded redundancy line information.

When encoding the redundancy line information the N redundancy address lines each representing a redundancy address line repaired for each segment are encoded using M-bit codes, wherein M is smaller than N. When decoding the encoded redundancy line information, the M-bit code information is decoded using information associated with the N redundancy address lines.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
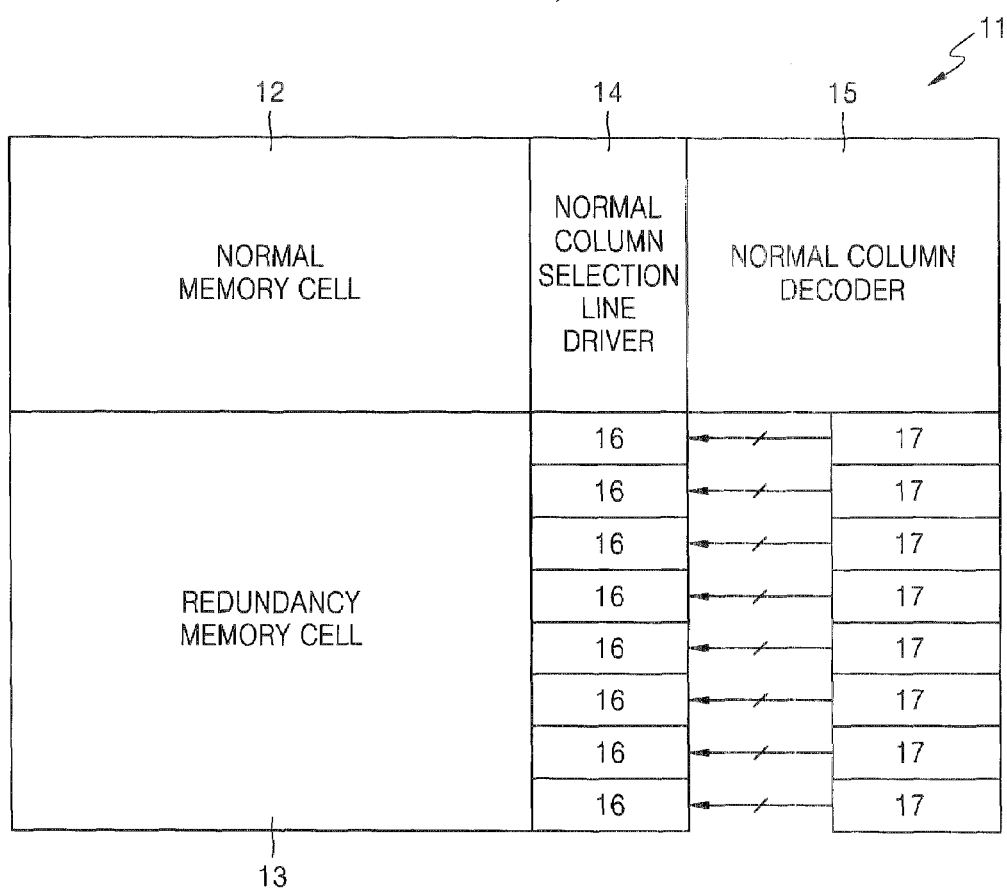
FIG. 1 shows a bank in a conventional multi-bank semiconductor memory device.
Figure 2:
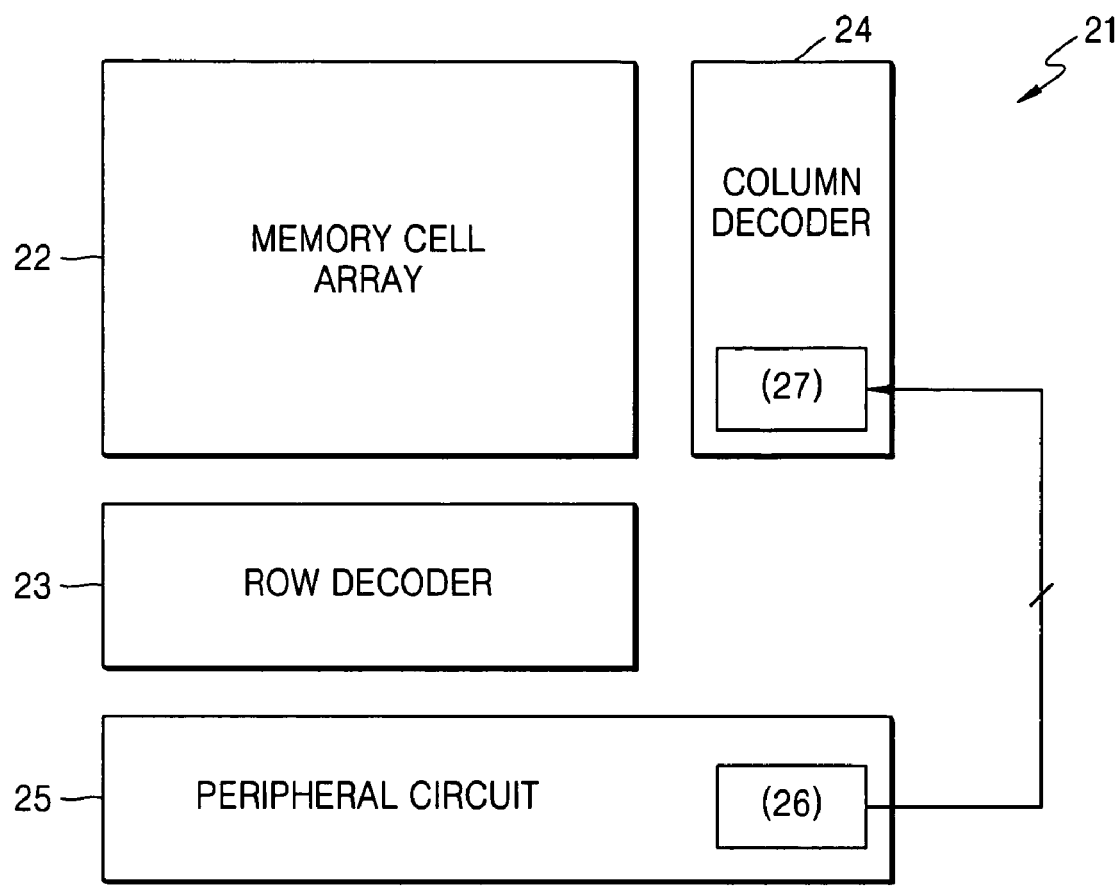
FIG. 2 shows a layout of a semiconductor memory device in a redundancy control circuit located in a peripheral circuit.

FIG. 2 shows a layout of a semiconductor memory device 21 in which a redundancy control circuit 26 is located in a peripheral circuit 25.

Referring to FIG. 2, the redundancy control circuit 26 is located separate from a redundancy column selection line driver 27. To reduce the size of a column decoder 24 and enhance the reliability of the semiconductor memory device 21, the redundancy control circuit 26 is located in the peripheral circuit 25. The redundancy control circuit 26 includes fuse boxes for setting addresses of redundancy lines and controls the redundancy column selection line driver 27.

As shown in FIG. 2, fuse repair information, which is set in the redundancy control circuit 26, should be transferred from the peripheral circuit 25 to the column decoder 24. Accordingly, a predetermined number of bus lines corresponding to the number of redundancy column selection lines should be arranged between the redundancy control circuit 26 and the redundancy column selection line driver 27.

If, however, a repaired redundancy memory cell is controlled by word lines rather than column lines, additional bus lines for transferring the fuse repair information between the redundancy control circuit 26 and a redundancy word line driver (not shown) in a row decoder 23 are needed.

Figure 3:
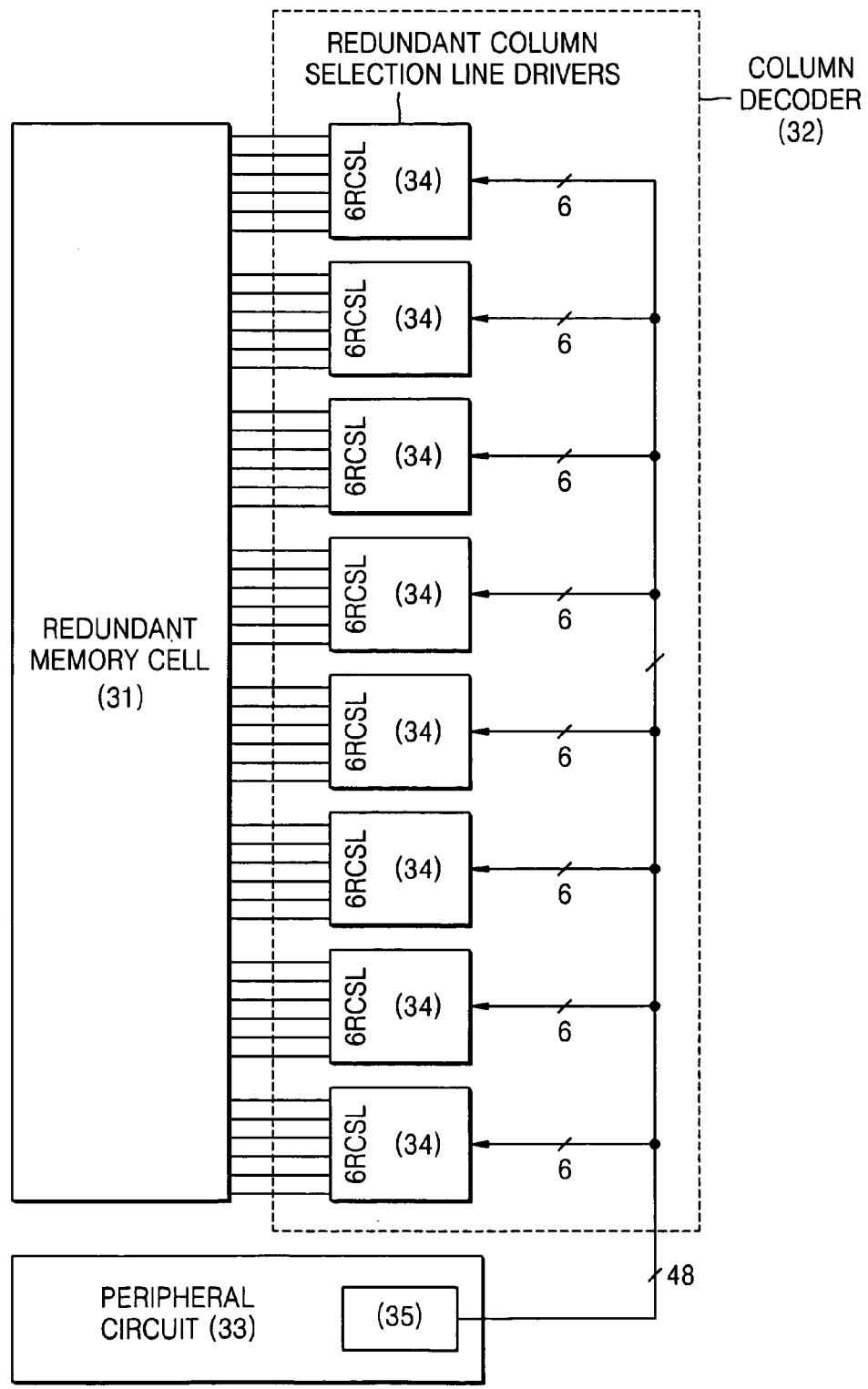
FIG. 3 illustrates bus connections when the redundancy control circuit is located in the peripheral circuit as shown in FIG. 2.

FIG. 3 illustrates bus connections when the redundancy control circuit 26 is located in the peripheral circuit 25, as shown in FIG. 2.

Referring to FIG. 3, each redundancy column selection line driver 34 includes 6 redundancy column selection lines (RCSLs) connected to a redundancy memory cell 31. If a redundancy column selection line driver group connected to the redundancy memory cell 31 of a bank in a multi-bank semiconductor memory device has, for example, 8 redundancy column selection line drivers, 48 bus lines are needed to transfer fuse repair information output from a peripheral circuit 33 to the 8 redundancy column selection line drivers of the column decoder 32. In other words, 48 bus lines should be provided between the peripheral circuit 33 and the column decoder 32 so that the bus lines are properly allocated to respective memory banks of the multi-bank semiconductor memory device.

As such, if 48 bus lines are provided between the column decoder 32 and a redundancy control circuit 35 located in the peripheral circuit 33 to transfer fuse repair information to the redundancy memory cell 31, more space is required for arranging the 48 bus lines.

Figure 4:
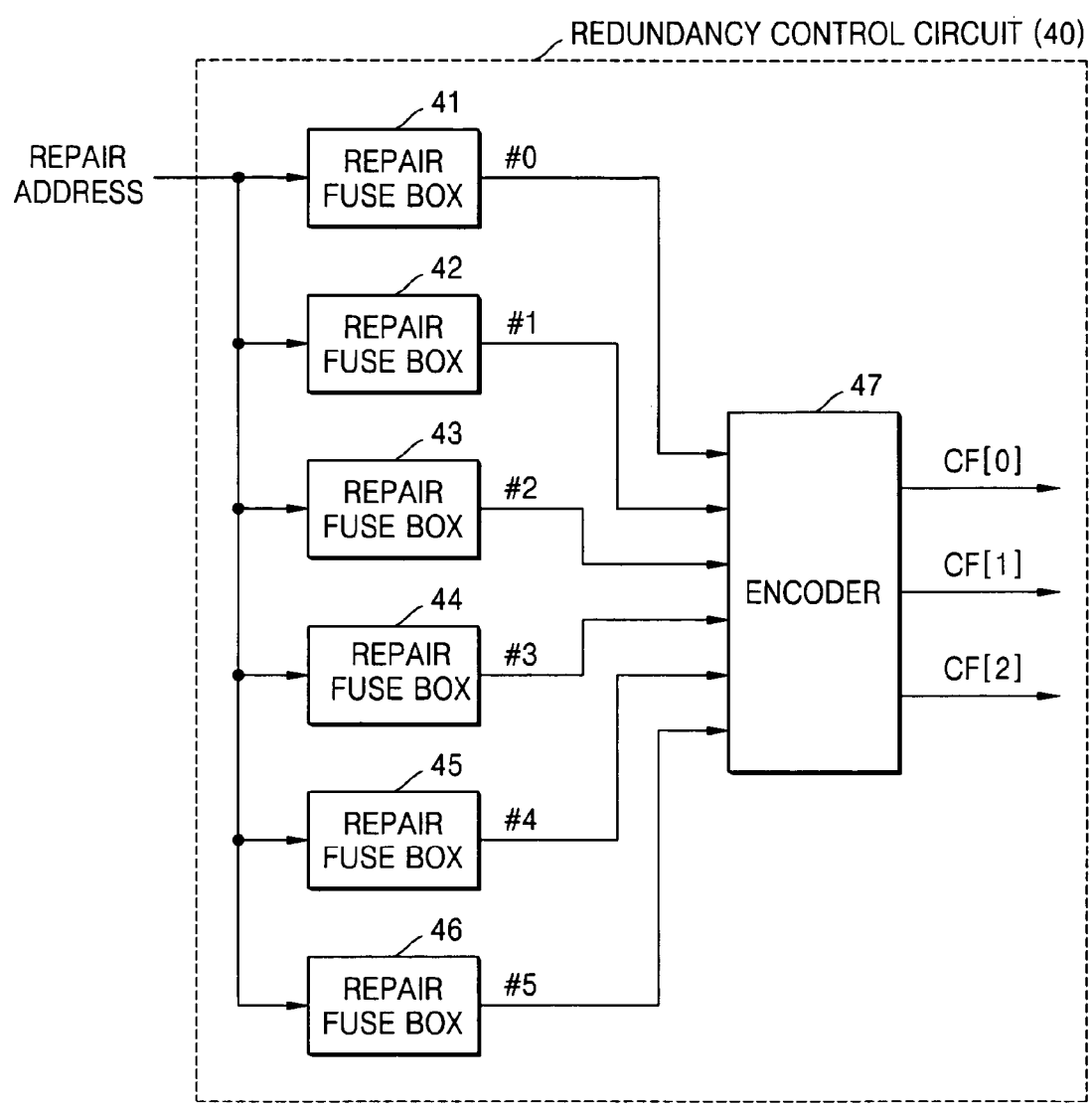
FIG. 4 is a block diagram of a redundancy control circuit using a repair method for a redundancy memory cell according to an exemplary embodiment of the present invention.

FIG. 4 is a block diagram of a redundancy control circuit 40 using a memory cell redundancy repair method according to an exemplary embodiment of the present invention.

FIG. 4 shows the redundancy control circuit 40 which may be one of a plurality of redundancy control circuits located in a peripheral circuit of a semiconductor memory device. The redundancy control circuit 40 includes 6 repair fuse boxes 41, 42, 43, 44, 45 and 46 for designating repair redundancy memory cells, and an encoder 47.

If a defect is detected in a normal memory cell, each repair fuse box 41, 42, 43, 44, 45 and 46 designates a redundancy memory cell that is to be used in place of the defective memory cell, so that the defective memory cell can be repaired using the redundancy memory cell by cutting a corresponding fuse with a laser beam. Accordingly, the repair fuse boxes 41, 42, 43, 44, 45, and 46 include fuse repair information corresponding to respective redundancy memory cells. Therefore, if an address received from an external source is equal to a repaired address, the received address is output to a redundancy column selection line driver to activate a corresponding RCSL.

In addition, because the fuse boxes 41 through 46 correspond to respective RCSLs, the redundancy control circuit 40 including the 6 repair fuse boxes 41 through 46 activates 6 RCSLs. Accordingly, as shown in FIG. 3, the 48 RCSLs are connected to 8 redundancy column selection line drivers 34.

As shown in FIG. 4, the repair fuse box 41 outputs fuse repair information #0 corresponding to a redundancy column selection line to an encoder 47, the repair fuse box 42 outputs fuse repair information #1 corresponding to a redundancy column selection line to the encoder 47, the repair fuse box 43 outputs fuse repair information #2 corresponding to a redundancy column selection line to the encoder, the repair fuse box 44 outputs fuse repair information #3 corresponding to a redundancy column selection line to the encoder 47, the repair fuse box 45 outputs fuse repair information #4 corresponding to a redundancy column selection line to the encoder 47, and the repair fuse box 46 outputs fuse repair information #5 corresponding to a redundancy column selection line to the encoder 47.

The encoder 47 receives the fuse repair information #0 through #5 from the 6 repair fuse boxes 41 through 46 and outputs code information encoded using corresponding 3-bit codes CF[0], CF[1] and CF[2] according to the received fuse repair information #0 through #5. The encoded code information CF[0], CF[1] and CF[2] are input to redundancy column selection line drivers 34 in a column decoder of the semiconductor memory device.

Figure 5:
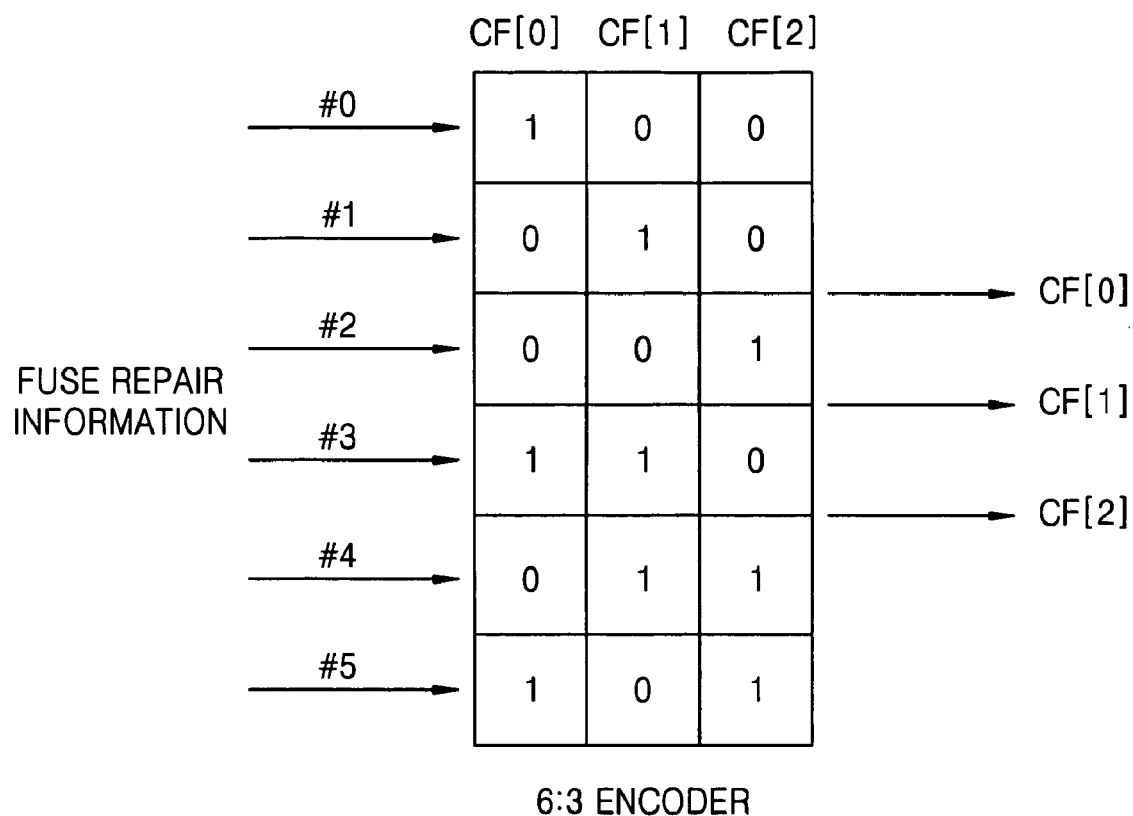
FIG. 5 is a view for explaining an encoding method performed by an encoder in a redundancy control circuit according to an exemplary embodiment of the present invention.

FIG. 5 is a view for explaining an encoding method performed by the encoder 47 in the redundancy control circuit 40 according to an exemplary embodiment of the present invention.

Referring to FIG. 5, the encoder 47 receives the fuse repair information #0 through #5 corresponding to 6 RCSLs of a redundancy column selection line driver 34. If the encoder 47 receives the fuse repair information #0 output from the repair fuse box 41, the encoder 47 outputs code information encoded with 3 bits of CF[0]=1, CF[1]=0 and CF[2]=0. If the encoder 47 receives the fuse repair information #1 output from the repair fuse box 42, the encoder 47 outputs code information with 3 bits of CF[0]=0, CF[1]=1 and CF[2]=0. If the encoder 47 receives the fuse repair information #2 output from the repair fuse box 43, the encoder 47 outputs code information with 3 bits of CF[0]=0, CF[1]=0 and CF[2]=1. If the encoder 47 receives the fuse repair information #3 output from the repair fuse box 44, the encoder 47 outputs code information with 3 bits of CF[0]=1, CF[1]=1 and CF[2]=0. If the encoder 47 receives the fuse repair information #4 output from the repair fuse box 45, the encoder 47 outputs code information with 3 bits of CF[0]=0, CF[1]=1 and CF[2]=1. If the encoder 47 receives the fuse repair information #5 output from the repair fuse box 46, the encoder 47 outputs code information with 3 bits of CF[0]=1, CF[1]=0 and CF[2]=1.

In other words, the encoder 47 can output code information corresponding to received fuse repair information. As a result, because input fuse repair information can be encoded using a small number of bits, the number of bits of the output code information with respect to the number of bits of the input fuse repair information is reduced. Accordingly, there are only three output bus lines provided by the encoder 47, for example, a bus line for CF[0] indicating the first bit information, a bus line for CF[1] indicating the second bit information and a bus line for CF[2] indicating the third bit information. Thus, the encoder 47 can perform encoding using code information having 3 bits which is, for example, a minimum integer not less than $\log_2 6$. Accordingly, the 6 bus lines are reduced to 3 bus lines by the encoder 47.

FIGS. 4 and 5 show an example in which a redundancy control circuit controls fuse repair information corresponding to 6 RCSLs. A redundancy control circuit may, however, control fuse repair information corresponding to N RCSLs (where N is an integer). In this case, code information encoded by the encoder 47 can be represented by M bits where M is a minimum integer not less than $\log_2 N$. For example, eight or less bits of fuse repair information can be encoded using 3 bits and sixteen or less bits of fuse repair information can be encoded using 4 bits. Therefore, as more column selection lines are controlled by a redundancy control circuit the smaller the required number of bus lines.

Figure 6:
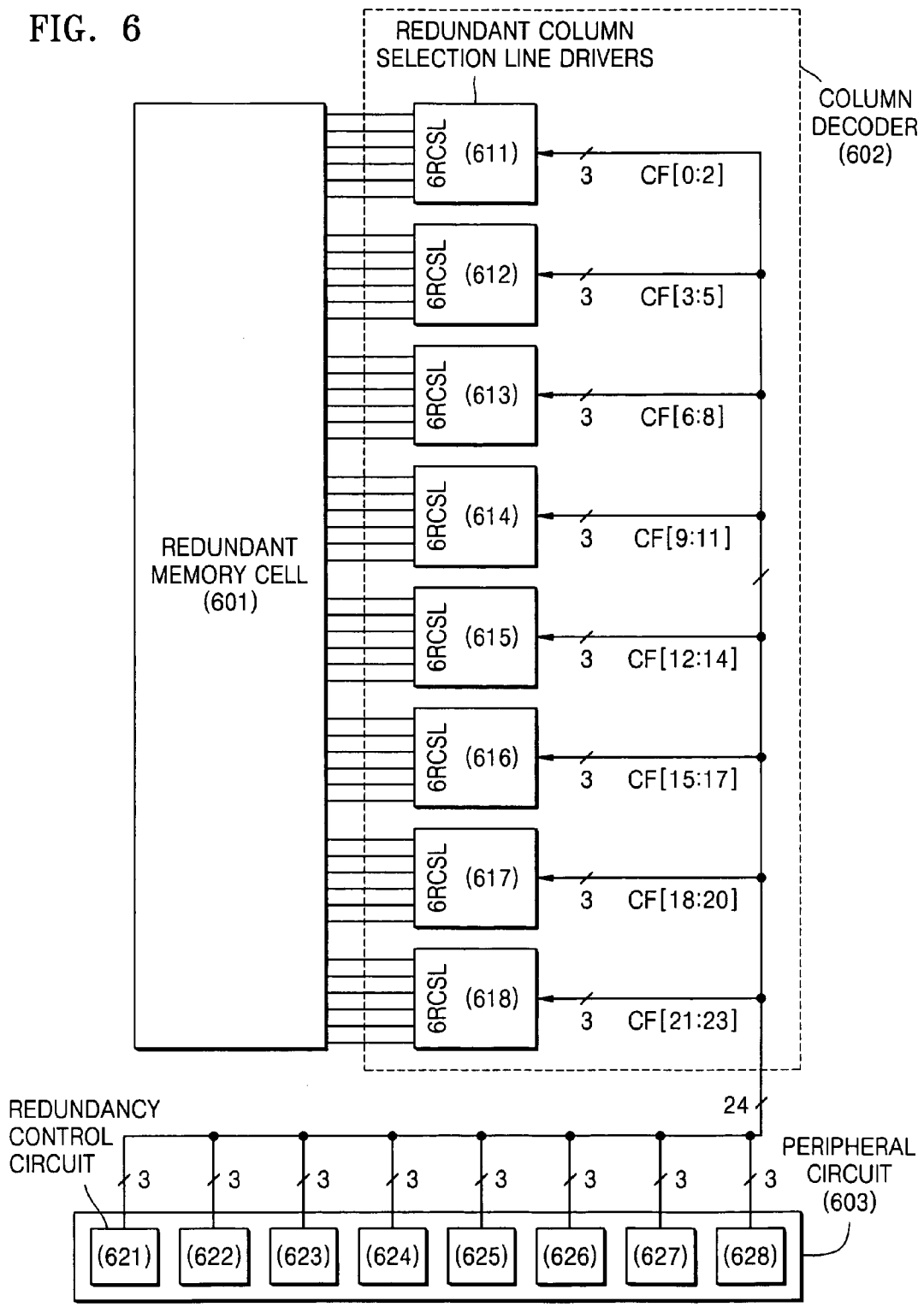
FIG. 6 illustrates bus connections when a redundancy control circuit is located in a peripheral circuit according to an exemplary embodiment of the present invention.

FIG. 6 illustrates bus connections when a redundancy control circuit is located in a peripheral circuit of a semiconductor memory device according to an exemplary embodiment of the present invention.

Referring to FIG. 6, 8 redundancy column selection line drivers 611 through 618 and 8 redundancy control circuits 621 through 628 are provided for a redundancy memory cell 601 in a memory bank of the semiconductor memory device. The 8 redundancy column selection line drivers 611 through 618 are located in a column decoder 602 of a semiconductor memory device, and the 8 redundancy control circuits 621 through 628 are located in a peripheral circuit 603 of the semiconductor memory device.

The redundancy control circuit 621 outputs code information CF[0:2] to the column decoder 602 and the code information CF[0:2] is input to the redundancy column selection line driver 611 in the column decoder 602. The redundancy control circuit 622 outputs code information CF[3:5] to the column decoder 602, and the code information CF[3:5] is input to the redundancy column selection line driver 612 in the column decoder 602. The redundancy control circuit 623 outputs code information CF[6:8] to the column decoder 602 and the code information CF[6:8] is input to the redundancy column selection line driver 613 in the column decoder 602. The redundancy control circuit 624 outputs code information CF[9:11] to the column decoder 602 and the code information CF[9:11] is input to the redundancy column selection line driver 614 in the column decoder 602. The redundancy control circuit 625 outputs code information CF[12:14] to the column decoder 602 and the code information CF[12:14] is input to the redundancy column selection line driver 615 in the column decoder 602. The redundancy control circuit 626 outputs code information CF[15:17] to the column decoder 602 and the code information CF[15:17] is input to the redundancy column selection line driver 616 in the column decoder 602. The redundancy control circuit 627 outputs code information CF[18:20] to the column decoder 602 and the code information CF[18:20] is input to the redundancy column selection line driver 617 in the column decoder 602. The redundancy control circuit 628 outputs code information CF[21:23] to the column decoder 602 and the code information CF[21:23] is input to the redundancy column selection line driver 618 in the column decoder 602.

Each of the encoded fuse code information bits CF[0:23] is decoded to address information corresponding to an RCSL in a corresponding redundancy column selection line driver 611 through 618, thereby activating a corresponding RCSL.

Accordingly, only 24 bus lines are needed to transfer fuse information from the peripheral circuit 603 to the column decoder 602, thus enhancing integration of the semiconductor memory device.

Figure 7:
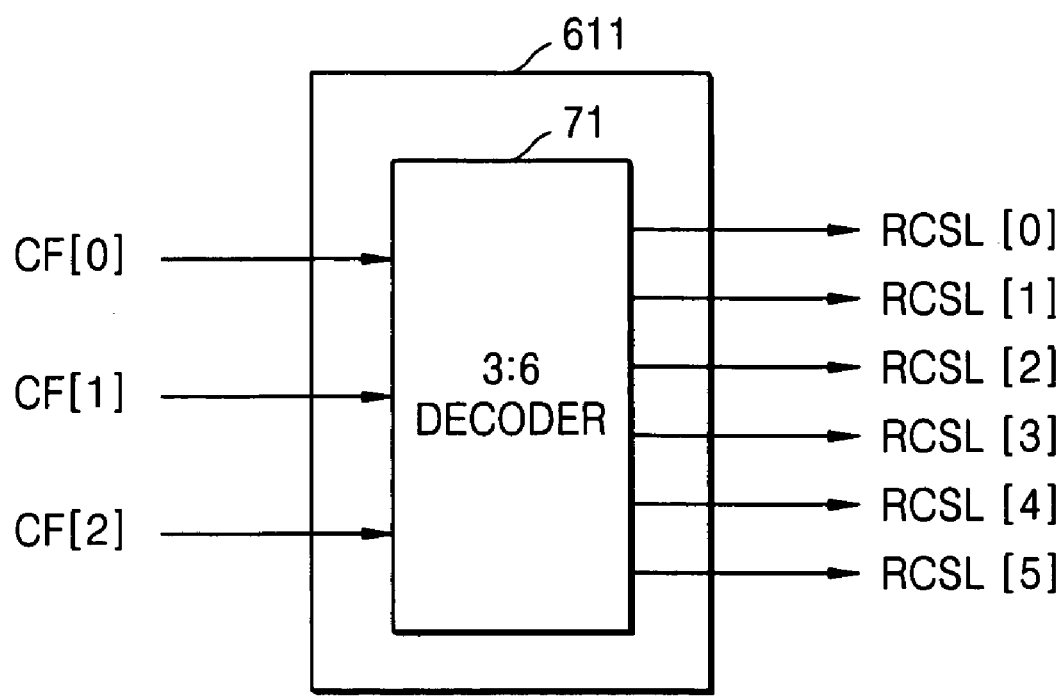
FIG. 7 is a view for explaining a decoding method performed by a redundancy column selection line driver according to an exemplary embodiment of the present invention.

FIG. 7 is a view for explaining a decoding method performed by the redundancy column selection line driver according to an exemplary embodiment of the present invention.

Referring to FIGS. 6 and 7, the redundancy column selection line driver 611 receives the code information CF[0:2]. The redundancy column selection line driver 611 includes a 3:6 decoder 71. The 3:6 decoder 71 decodes the received code information encoded by the encoder 47 of the redundancy control circuit 40 shown in FIG. 4. The 3:6 decoder 71 outputs 6 redundancy column selection line enable signals RCSL[0] through RCSL[5] according to the received 3-bit code information.

The redundancy column selection line driver 611 activates a redundancy column selection line corresponding to fuse repair information #0 if the received code information CF[0:2] is 100, activates a redundancy column selection line corresponding to fuse repair information #1 if the received code information CF[0:2] is 010, activates a redundancy column selection line corresponding to fuse repair information #2 if the received code information CF[0:2] is 001, activates a redundancy column selection line corresponding to fuse repair information #3 if the received code information CF[0:2] is 110, activates a redundancy column selection line corresponding to fuse repair information #4 if the received code information CF[0:2] is 011, and activates a redundancy column selection line corresponding to fuse repair information #5 if the received code information CF[0:2] is 101.

Figure 8:
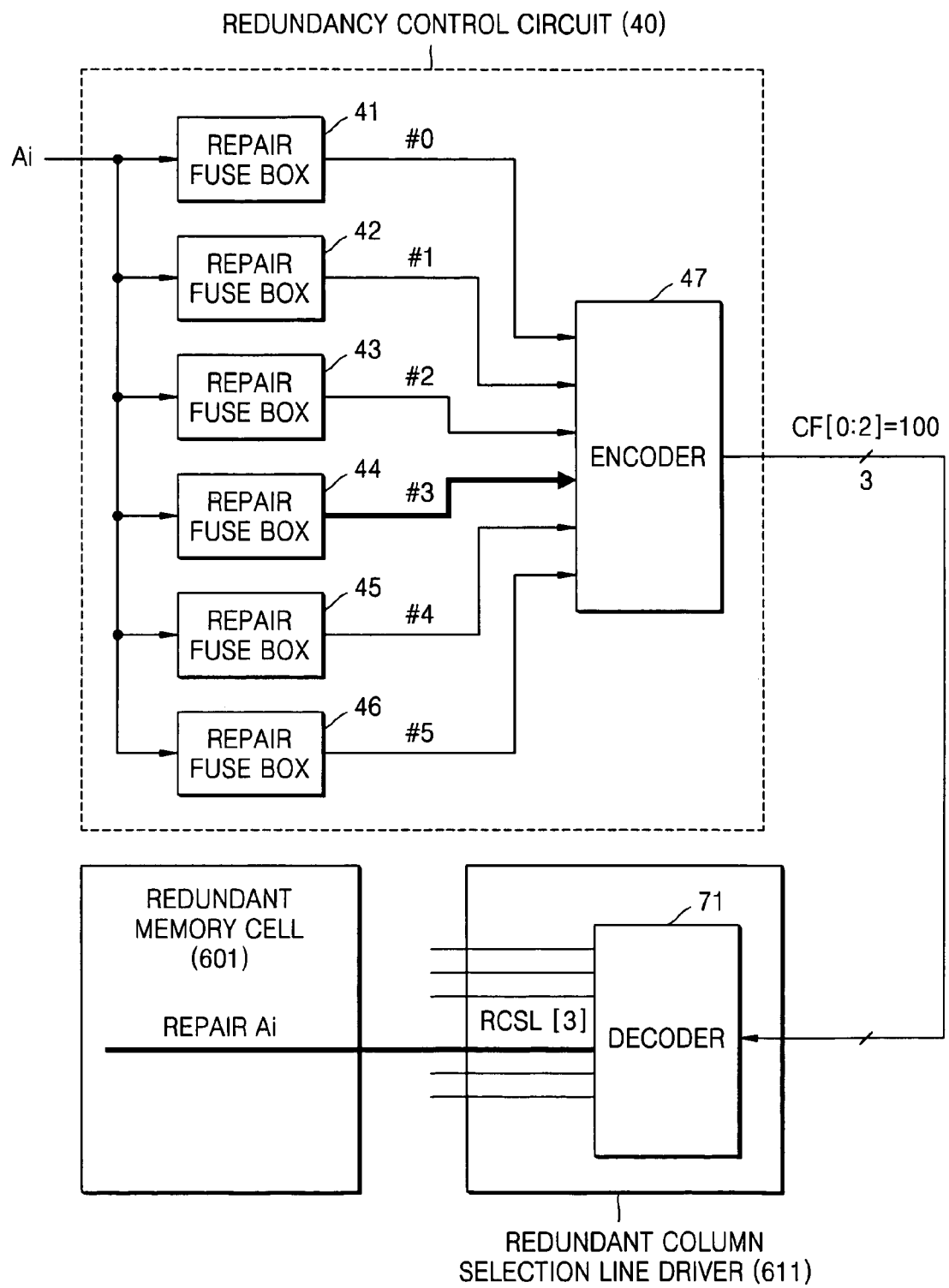
FIG. 8 is a view for explaining a memory cell repair method performed by the redundancy control circuit shown in FIG. 4 according to an exemplary embodiment of the present invention.

FIG. 8 is a view for explaining a memory cell repair method performed by the redundancy control circuit shown in FIG. 4 according to an exemplary embodiment of the present invention.

Referring to FIG. 8, if an address Ai is received from an external source, the redundancy control circuit 40 determines whether the address Ai is a repair address corresponding to an RCSL in a redundancy memory cell, set, for example, by the repair fuse box 44. If the address Ai is the repair address, the redundancy control circuit 40 outputs the fuse repair information #3 corresponding to a repair RCSL.

If the encoder 47 receives the fuse repair information #3 from the repair fuse box 44, the encoder 47 outputs code information CF[0:2]=100 corresponding to the fuse repair information #3. Then, a decoder 71 of the redundancy column selection line driver 611 receives and decodes the code information CF[0:2]=100 to activate a corresponding RCSL[3]. Accordingly, a repair memory cell corresponding to the RCSL[3] is activated instead of a defective normal memory cell.

According to the redundancy repair method and circuit of the present invention, by locating the redundancy control circuit, which includes fuse boxes in the peripheral circuit instead of the column decoder, the size of the column decoder is reduced. In addition, the number of bus lines required for transferring fuse information from the peripheral circuit to the column decoder is reduced. Accordingly, the circuit area of a semiconductor memory device can be reduced, thus increasing the capacity of the semiconductor memory device and enhancing integration of the semiconductor memory device.

In an exemplary embodiment of the present invention, a redundancy memory cell connected to RCSLs is described, however, the redundancy memory cell can be connected to redundancy word lines. In the latter case, the redundancy control circuit can also be arranged in the peripheral circuit separate from the column and/or row decoder.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A redundancy repair circuit in a semiconductor memory device, the circuit comprising:
   a memory circuit having a plurality of address lines and a plurality of redundancy address lines in a memory cell;
   a repair redundancy control circuit for repairing a defective address line using a redundancy address line of the plurality of redundancy address lines, and for encoding and outputting fuse repair information corresponding to redundancy address information, wherein addresses corresponding to defective memory cells are pre-programmed; and
   a redundancy line driver for receiving the encoded fuse repair information from the repair redundancy control circuit, for decoding the encoded fuse repair information and for activating a redundancy line corresponding to the decoded fuse repair information,
   wherein the repair redundancy control circuit is located in a peripheral circuit of the semiconductor memory device and is separate and apart from the redundancy line driver.

2. The circuit of claim 1, wherein the repair redundancy control circuit comprises:
an encoder for encoding N redundancy address lines each representing a redundancy address line repaired for each segment using M-bit code information, wherein M is smaller than N.

3. The circuit of claim 2, wherein M is an integer not less than $\log_2 N$.

4. The circuit of claim 2, wherein the redundancy line driver comprises:
a decoder for decoding M-bit code information output from the encoder and for outputting the decoded M-bit code information to a corresponding redundancy address line.

5. The circuit of claim 3, wherein each segment includes 6 redundancy address lines and the encoder encodes the 6 redundancy address lines using 3-bit code information.

6. The circuit of claim 1, wherein the redundancy address line is a column redundancy address line.

7. The circuit of claim 6, wherein the redundancy line driver is located in a column decoder of the semiconductor memory device.

8. The circuit of claim 1, wherein the redundancy address line is a row redundancy address line.

9. The circuit of claim 8, wherein the redundancy line driver is located in a row decoder of the semiconductor memory device.

10. A semiconductor memory device, comprising:
a redundancy memory cell for repairing a defective memory cell in a memory cell array;
a repair redundancy control circuit for repairing a defective address line using a redundancy address line and for coding redundancy line information designating an address of the redundancy memory cell using a number of bits, wherein addresses corresponding to defective memory cells are pre-programmed; and
a redundancy line driver for decoding the coded information using a number of bits and for activating a redundancy address line corresponding to a redundancy address of the decoded code information,
wherein the repair redundancy control circuit is located in a peripheral circuit of the semiconductor memory device and separate from the redundancy line driver.

11. The device of claim 10, wherein the redundancy line driver is located in an address decoder of the semiconductor memory device.

12. The device of claim 10, wherein the repair redundancy control circuit includes a plurality of fuse boxes for programming the addresses to designate the defective memory cells.

13. The device of claim 10, wherein the repair redundancy control circuit comprises:
an encoder for encoding N redundancy address lines each representing a redundancy address line repaired for each segment using M-bit code information, wherein M is smaller than N.

14. The device of claim 13, wherein M is an integer not less than $\log_2 N$.

15. The device of claim 13, wherein the redundancy line driver comprises:
a decoder for decoding M-bit code information output from the encoder and for outputting the decoded M-bit code information to a corresponding redundancy address line.

16. The device of claim 15, wherein the redundancy address line is a column redundancy address line and the redundancy line driver is located in a column decoder circuit.

17. The device of claim 15, wherein the redundancy address line is a row redundancy address line and the redundancy line driver is located in a row decoder circuit.

18. A redundancy repair method of a semiconductor memory device, comprising:
inputting an address to a redundancy control circuit located in a peripheral circuit of the semiconductor memory device;
determining whether the input address is a redundancy address;
generating redundancy line information designating the redundancy address if the input address is the redundancy address;
encoding the redundancy line information including fuse repair information using a number of bits;
outputting the encoded redundancy line information including the fuse repair information from the redundancy control circuit and inputting the encoded redundancy line information including the fuse repair information to a redundant line driver that is separate and apart from the redundancy control circuit;
decoding the encoded redundancy line information including the fuse repair information; and
activating a redundancy address line corresponding to the redundancy address according to the decoded redundancy line information including the fuse repair information.

19. The method of claim 18, wherein when encoding the redundancy line information N redundancy address lines each representing a redundancy address line repaired for each segment are encoded using M-bit codes, wherein M is smaller than N.

20. The method of claim 19, wherein when decoding the encoded redundancy line information, the M-bit code information is decoded using information associated with the N redundancy address lines.

* * * * *